(12) United States Patent
Tomioka

(10) Patent No.: US 7,352,581 B2
(45) Date of Patent: Apr. 1, 2008

(54) COOLING DEVICE AND ELECTRONIC APPARATUS

(75) Inventor: Kentaro Tomioka, Sayama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/473,850

(22) Filed: Jun. 23, 2006

(65) Prior Publication Data

US 2007/0002538 A1 Jan. 4, 2007

(30) Foreign Application Priority Data

Jun. 30, 2005 (JP) ............................ P2005-193139

(51) Int. Cl.
*H05K 7/20* (2006.01)
*F28D 15/00* (2006.01)

(52) U.S. Cl. ...................... 361/702; 361/699; 361/704; 361/722; 165/80.4; 165/104.33; 165/185

(58) Field of Classification Search ................ 361/697, 361/699–703, 704, 722; 165/80.4, 185, 104.33; 174/252; 257/E23.098
See application file for complete search history.

(56) References Cited

U.S. PATENT DOCUMENTS

| 5,901,037 | A  | * | 5/1999  | Hamilton et al. | ............ | 361/699 |
| 6,529,377 | B1 | * | 3/2003  | Nelson et al.   | ............ | 361/699 |
| 6,626,233 | B1 | * | 9/2003  | Connors         | ............ | 165/80.3 |
| 6,827,128 | B2 | * | 12/2004 | Philpott et al. | ............ | 165/46  |
| 6,859,364 | B2 | * | 2/2005  | Yuasa et al.    | ............ | 361/687 |
| 6,904,966 | B2 | * | 6/2005  | Philpott et al. | ............ | 165/185 |
| 6,935,412 | B2 | * | 8/2005  | Mueller         | ............ | 165/80.4 |
| 6,942,019 | B2 | * | 9/2005  | Pikovsky et al. | ............ | 165/80.4 |
| 6,961,244 | B2 | * | 11/2005 | Tsuchiya et al. | ............ | 361/710 |
| 6,966,361 | B2 | * | 11/2005 | Connors         | ............ | 165/104.33 |

(Continued)

FOREIGN PATENT DOCUMENTS

JP 2000-193385 7/2000

(Continued)

OTHER PUBLICATIONS

United States Office Action dated Jun. 6, 2007 for U.S. Appl. No 11/473,777, filed Jun. 23, 2006 entitled Cooling Device and Electronic Apparatus.

(Continued)

*Primary Examiner*—Jayprakash Gandhi
*Assistant Examiner*—Robert J Hoffberg
(74) *Attorney, Agent, or Firm*—Blakely, Sokoloff, Taylor & Zafman

(57) ABSTRACT

According to one embodiment, a cooling device includes: a heat transfer unit thermally connected to a mounted first heating element and a mounted second heating element whose mounted height is higher than that of the first heating element, the heat transfer unit including a passage through which a coolant circulates, a heat-receiving section having a first portion thermally connected to the first heating element and a second portion thermally connected to the second heating element, a heat-sinking section that dissipates heat received by the heat-receiving section, a first plate member in which is formed a first groove corresponding to the passage, and a second plate member that covers the first groove. The heat-receiving section is formed at least one of the first and second plate members.

18 Claims, 12 Drawing Sheets

U.S. PATENT DOCUMENTS

| | | | |
|---|---|---|---|
| 7,110,258 B2 * | 9/2006 | Ding et al. | 361/699 |
| 7,184,265 B2 * | 2/2007 | Kim et al. | 361/687 |
| 2002/0195230 A1 * | 12/2002 | Li | 165/104.33 |
| 2004/0240178 A1 * | 12/2004 | Kim et al. | 361/695 |
| 2005/0006115 A1 * | 1/2005 | Ding et al. | 174/15.6 |
| 2006/0162901 A1 * | 7/2006 | Aizono et al. | 165/80.4 |

FOREIGN PATENT DOCUMENTS

| | | |
|---|---|---|
| JP | 2001-068887 | 3/2001 |
| JP | 2005-007459 | 1/2005 |
| TW | 535486 A * | 6/2003 |

OTHER PUBLICATIONS

United States Office Action dated Sep. 19, 2007 for U.S. Appl. No. 11/473,777, filed Jun. 23, 2006 entitled Cooling Device and Electronic Apparatus.

United States Office Action dated Jun. 5, 2007 for U.S. Appl. No. 11/474,178, filed Jun. 23, 2006 entitled Cooling Device and Electronic Apparatus.

United States Office Action dated Sep. 19, 2007 for U.S. Appl. No. 11/474,178, filed Jun. 23, 2006 entitled Cooling Device and Electronic Apparatus.

* cited by examiner

COOLING DEVICE AND ELECTRONIC APPARATUS

CROSS-REFERENCE TO RELATED APPLICATIONS

This application is based upon and claims the benefit of priority from Japanese Patent Application No. 2005-193139, filed Jun. 30, 2005, the entire contents of which are incorporated herein by reference.

BACKGROUND

1. Field

One embodiment of the present invention relates to a cooling device for cooling a plurality of heating elements. Another embodiment of the present invention relates to an electronic apparatus equipped with the cooling device.

2. Description of the Related Art

An electronic apparatus, including a portable computer, has a plurality of heating elements such as a CPU and a VGA (Video Graphics Array).

The amount of heat originating from the CPU and the VGA increases in accordance with an increase in the processing speed of the CPU and the VGA or as the CPU and the VGA become multifunctional. As the amount of heat increases, the CPU and VGA operate less efficiently or become inoperative.

As a cooling device that cools a plurality of heating elements, there has been proposed a structure that is used commonly for the heating elements and has a passage thermally connected to respective heating elements. Coolant circulates through the passage. Since the passage is used commonly among the plurality of heating elements, the number of parts of the cooling device is reduced, thereby simplifying the structure of the cooling device (see, e.g., JP-A-2001-68887).

Meanwhile, an electronic apparatus is tend to be slimmed down. In accordance with slimming down, a cooling device for cooling a heating element, such as a CPU, is also tend to be made slim. As a measure for slimming the cooling device, a passage through which a coolant flows has been formed thin.

In order to prevent reduction in the strength of the passage, which would otherwise be caused by slimming down, a multi-hole pipe having a plurality of holes is adopted for the passage. Since partition walls that partition the holes function as columns, the required strength of the multi-hole pipe is ensured.

The multi-hole pipe of this type is formed by means of, e.g., extrusion molding (see, e.g., JP-A-2000-193385).

Alternatively, the multi-hole pipe of this type has a structure having a first plate-like body whose one surface has a plurality of protruding sections, and a second plate-like body having recessed sections to fit the protruding sections. By means of the protruding sections of the first plate-like body fitting the recessed sections of the second plate-like body, the protruding sections and the recessed sections constitute partition walls, to thus form a plurality of holes (see, e.g., JP-A-2005-7459). The first and second plate-like bodies disclosed in JP-A-2005-7459 are formed by means of rolling.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described below in detail with reference to the drawings. In general, according to one embodiment of the invention, a cooling device includes: a heat transfer unit thermally connected to a mounted first heating element and a mounted second heating element whose mounted height is higher than that of the first heating element, the heat transfer unit including a passage through which a coolant circulates, a heat-receiving section having a first portion thermally connected to the first heating element and a second portion thermally connected to the second heating element, a heat-sinking section that dissipates heat received by the heat-receiving section, a first plate member in which is formed a first groove corresponding to the passage, and a second plate member that covers the first groove, wherein the heat-receiving section is formed at least one of the first and second plate members.

By means of taking a portable computer 10 as an example, an electronic apparatus according to a first embodiment of the present invention will be described with reference to FIGS. 1 through 9.

Figure 1:
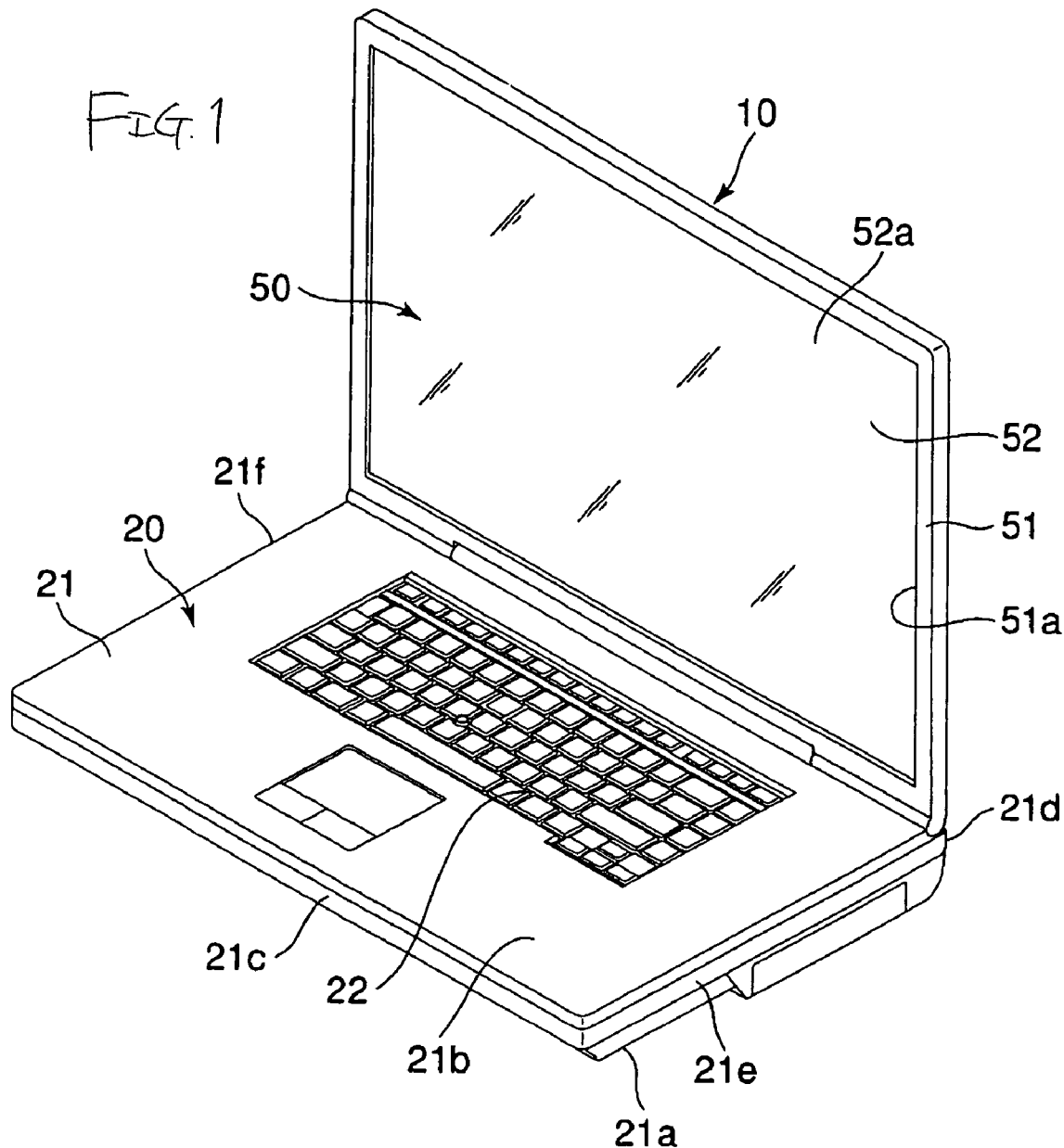
FIG. 1 is an exemplary perspective view of a portable computer according to a first embodiment of the present invention.

FIG. 1 shows a portable computer 10. As shown in FIG. 1, the portable computer 10 has a computer main body 20 and a display unit 50.

The computer main body 20 has a first casing 21. The first casing 21 assumes the shape of an essentially oblate box. The first casing 21 has a bottom wall 21a, an upper wall 21b, a front wall 21c, a rear wall 21d, a left side wall 21e, and a right side wall 21f.

The upper wall 21b supports a keyboard 22. The front wall 21c, the left side wall 21e, the right side wall 21f, and the rear wall 21d constitute a circumferential wall that extends in the circumferential direction of the first casing 21.

Figure 2:
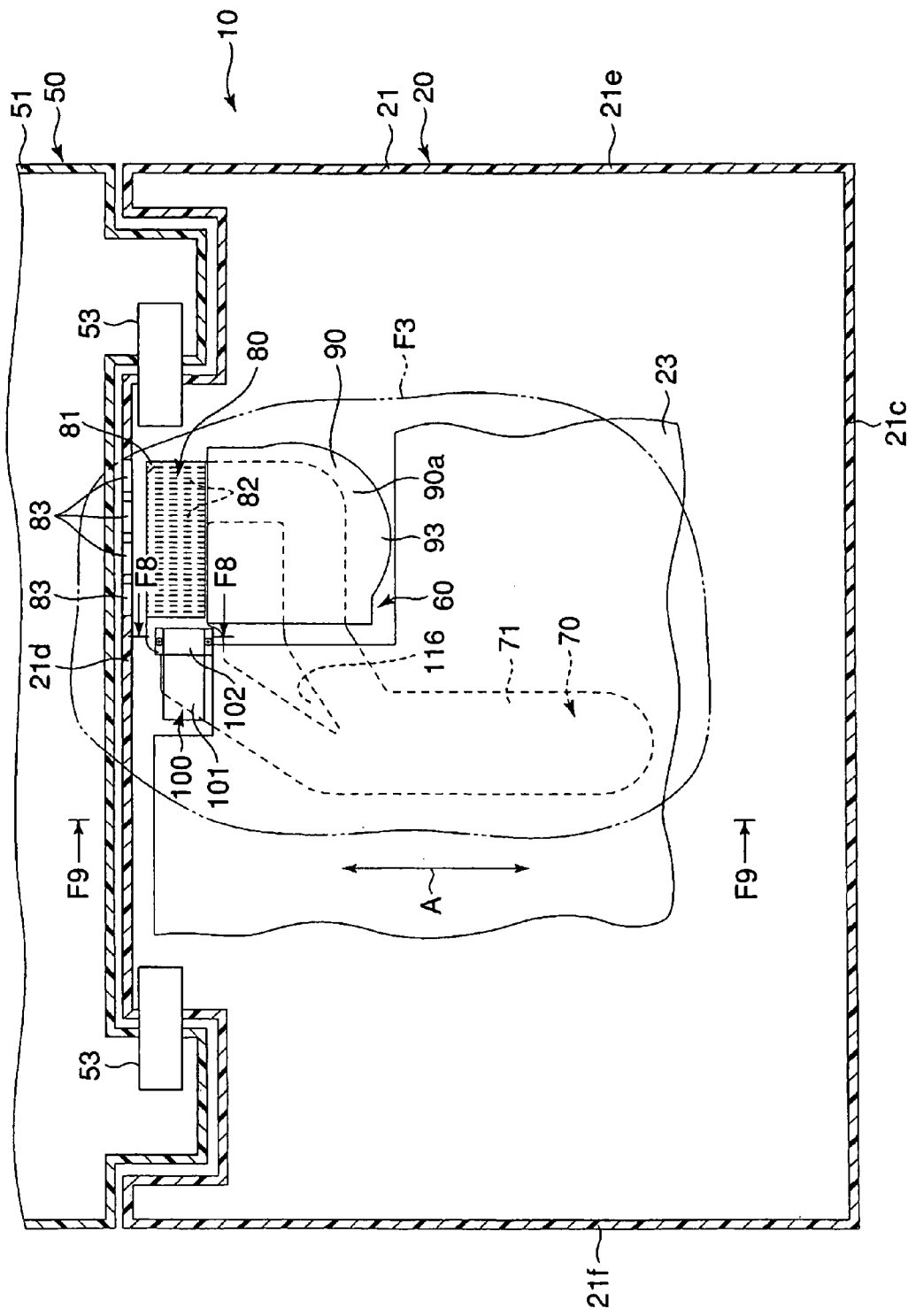
FIG. 2 is an exemplary plan view of the inside of a computer main body shown in FIG. 1 when viewed from above.

FIG. 2 shows a view in which the upper wall 21b of the computer main body 20 is cut away. FIG. 2 shows the inside of the computer main body 20 when viewed from above. As shown in FIG. 2, a printed circuit board 23 is housed in the first casing 21.

Figure 3:
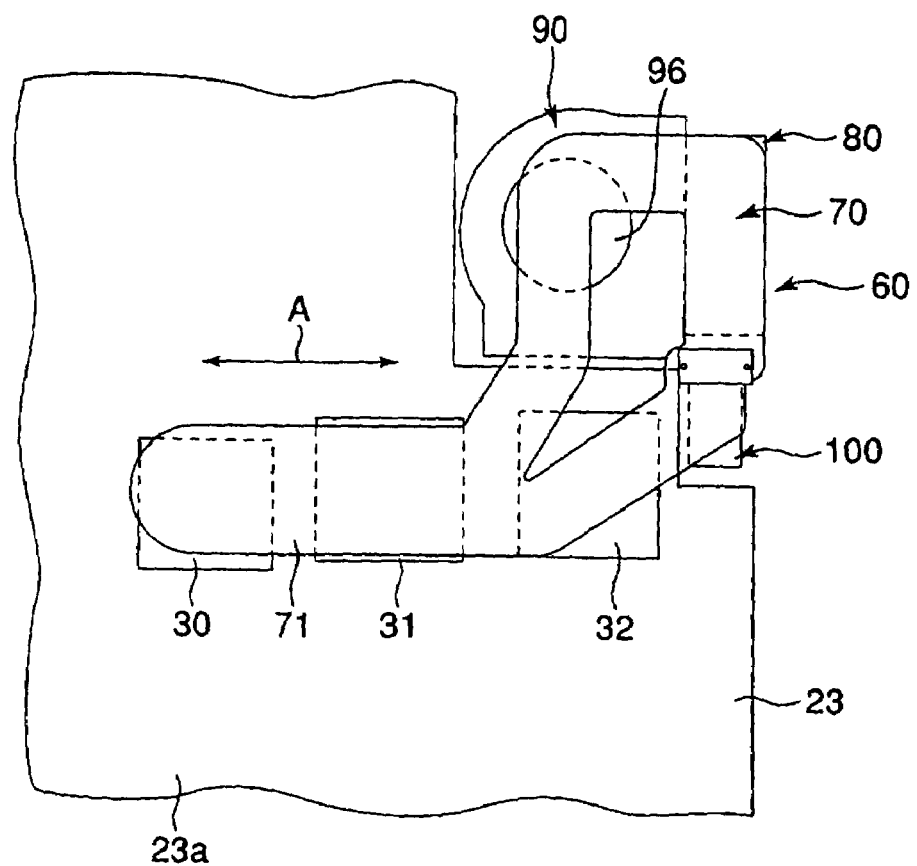
FIG. 3 is an exemplary plan view of an area indicated by reference symbol F3 shown in FIG. 2 when viewed from below.

FIG. 3 is an exemplary plan view of a vicinity of the printed circuit board 23, the area being enclosed with reference symbol F3 in FIG. 2, when viewed from below. As shown in FIG. 3, first through third heating elements 30, 31, 32, e.g., a CPU and a VGA (Video Graphics Array), are mounted on the lower surface of the printed circuit board 23.

The first through third heating elements 30, 31, and 32 are arranged in a substantially linear pattern in, e.g., direction A denoted by the arrow in the drawing. Direction A extends in, e.g., the longitudinal direction of the computer main body 20.

As shown in FIG. 1, the display unit 50 has a second casing 51 and a liquid-crystal display panel 52. The liquid-crystal display panel 52 is housed in the second casing 51. The liquid-crystal display panel 52 has a screen 52a for displaying an image. The screen 52a is exposed outside of the second casing 51 through an aperture section 51a formed in the front of the second casing 51.

The second casing 51 can pivot between a closed position where the second casing 51 lies on the computer main body 20 and an open position where the second casing 51 stands relative to the computer main body 20 such that the keyboard 22 and the screen 52a are exposed. The second casing 51 is joined to the first casing 21 by means of a shaft 53.

The portable computer 10 has a cooling device 60 for cooling the first through third heating elements 30, 31, and 32. As shown in FIGS. 2 and 3, the cooling device 60 is disposed in the vicinity of the first through third heating elements 30, 31, and 32 within the computer main body 20.

The cooling device 60 has a heat transfer member 70, a fin 80, a fan 90, and a pump 100. In the present invention, the heat transfer member is an example of a heat transfer unit.

Figure 4:
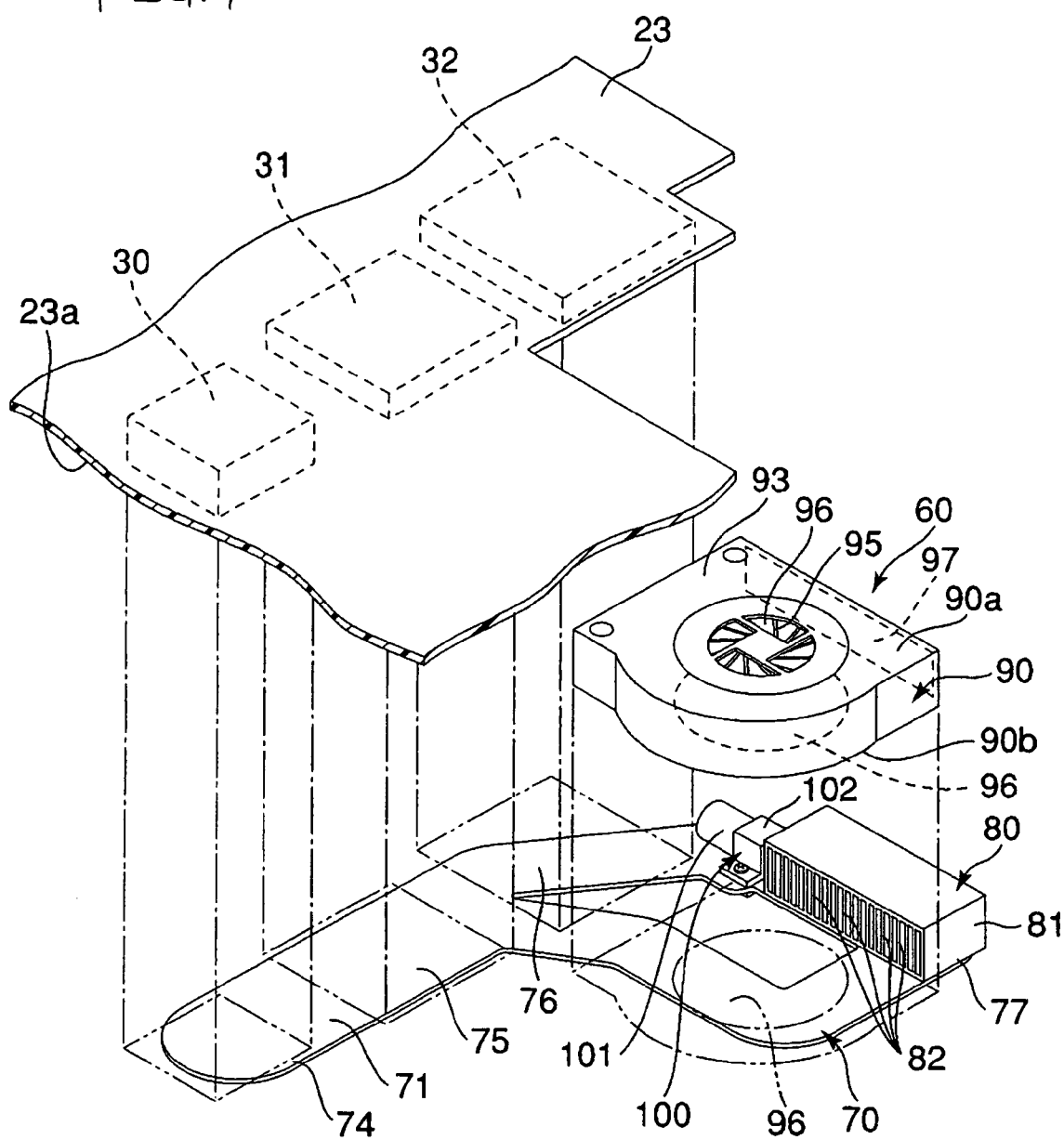
FIG. 4 is an exemplary perspective view showing a spatial relationship among a cooling device, a printed board and first to third heating elements, all of which are shown in FIG. 3, and an exploded state of these elements.

FIG. 4 is a perspective view showing the relationship of relative arrangement among the cooling device 60, the printed circuit board 23, and the first through third heating elements 30 to 32, as well as showing an exploded state of these elements. As shown in FIG. 4, the heat transfer member 70 assumes an essentially-L-shaped form having a linear section 71 opposing the first and second heating elements 30, 31. The third heating element 32 opposes the position which is slightly deviated from the linear section 71 in the heat transfer member 70.

Put another way, the heat transfer member 70 is formed into a substantially-L-shaped form in consideration of the arrangement of the first through third heating elements 30 to 32.

Figure 5:
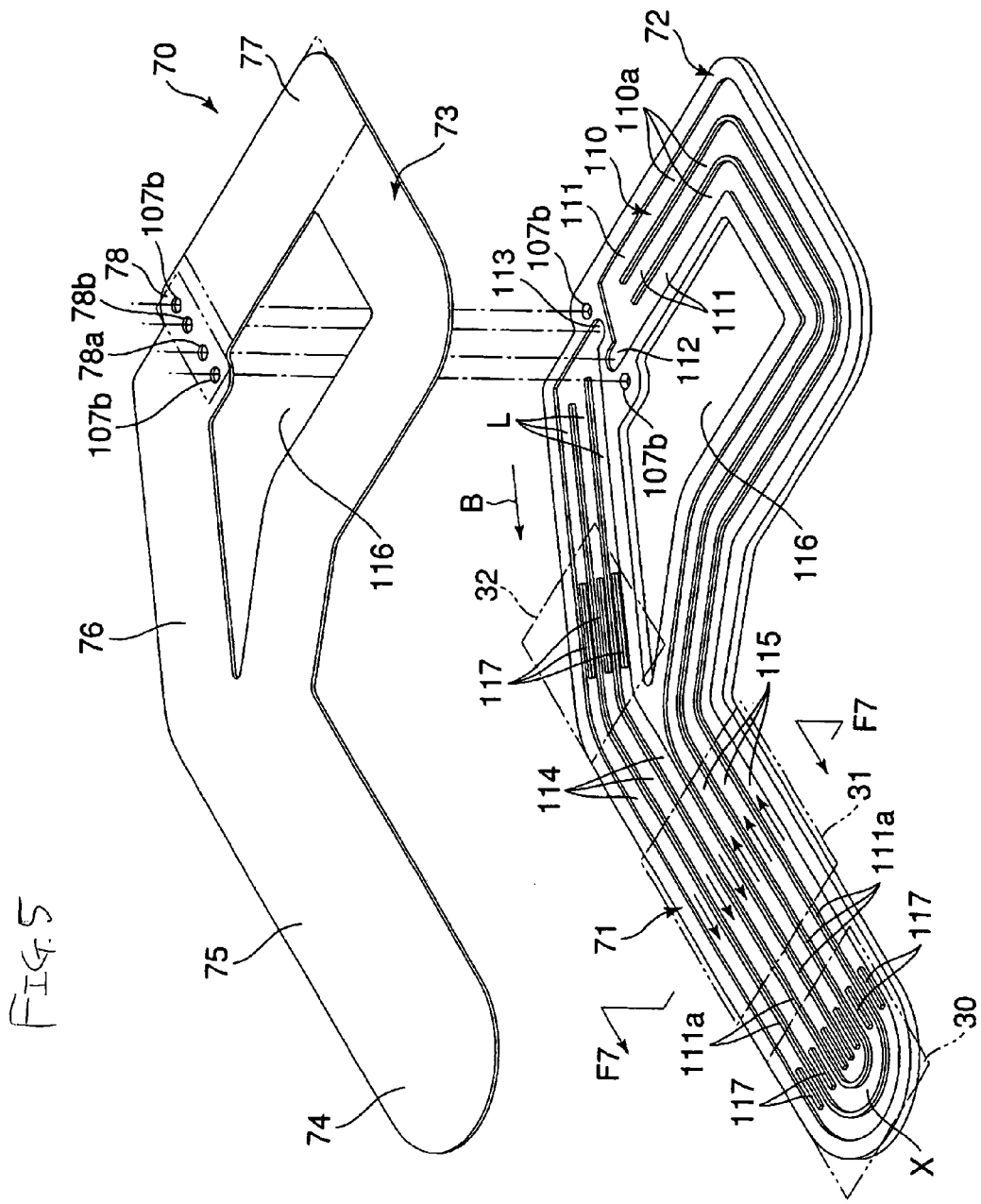
FIG. 5 is an exemplary perspective view showing an exploded state of a heat transfer member shown in FIG. 4.

The heat transfer member 70 has a first plate member 72 and a second plate member 73. FIG. 5 shows an exploded state of the heat transfer member 70. The heat transfer member 70 is formed by stacking the first plate member 72 and the second plate member 73 one on top of the other. In the drawing, the first plate member 72 is located in a lower position. In the drawing, the second plate member 73 is situated in an upper position.

As shown in FIG. 5, the first and second plate members 72, 73 are formed so as to correspond to the shape of the heat transfer member 70. Consequently, the first and second plate members 72, 73 are substantially of the same shape when viewed from above. As mentioned above, the first and second plate members 72, 73 are in the form of a substantial L shape. The thickness of the first plate member 72 is substantially uniform. The thickness of the first plate member 72 is, e.g., 0.1 mm or thereabouts. The thickness of the second plate member 73 is substantially uniform. The thickness of the second plate member 73 is, e.g., about 0.4 mm. Therefore, the thickness of the heat transfer member 70 is about 0.5 mm.

The heat transfer member 70 has a first heat-receiving section 74, a second heat-receiving section 75, a third heat-receiving section 76, a heat-sinking section 77, a pump mount section 78, and a passage 110.

The first heat-receiving section 74 is thermally connected to the first heating element 30. The second heat-receiving section 75 is thermally connected to the second heating element 31. The third heat-receiving section 76 is thermally connected to the third heating element 32.

As indicated by a two-dot chain line in FIG. 4, the first through third heat-receiving sections 74 to 76 are formed in areas of the heat transfer member 70 which oppose the corresponding first through third heating elements 30 to 32.

In the embodiment, the first through third heating elements 30 to 32 are mounted on a lower surface 23a of the printed circuit board 23. The heat transfer member 70 is placed beneath the first through third heating elements 30 to 32. Consequently, the first through third heat-receiving sections 74 to 76 are formed in the second plate member 73.

As will be described later, the first and second plate members 72, 73 constitute the form of a multi-hole pipe having a plurality of passage sections 110a. Accordingly, the first through third heat-receiving sections 74 to 76 have an area where the heat-receiving sections are sufficiently thermally connected to the corresponding first through third heating elements 30 to 32. In short, the respective heat-receiving sections are formed so as to correspond to the shapes of the heating elements.

As shown in FIG. 4, the heat-sinking section 77 is a portion of the heat transfer member 70 to which the fin 80 to be described later is thermally connected. The heat-sinking section 77 is formed so as to correspond to the fin 80.

Figure 6:
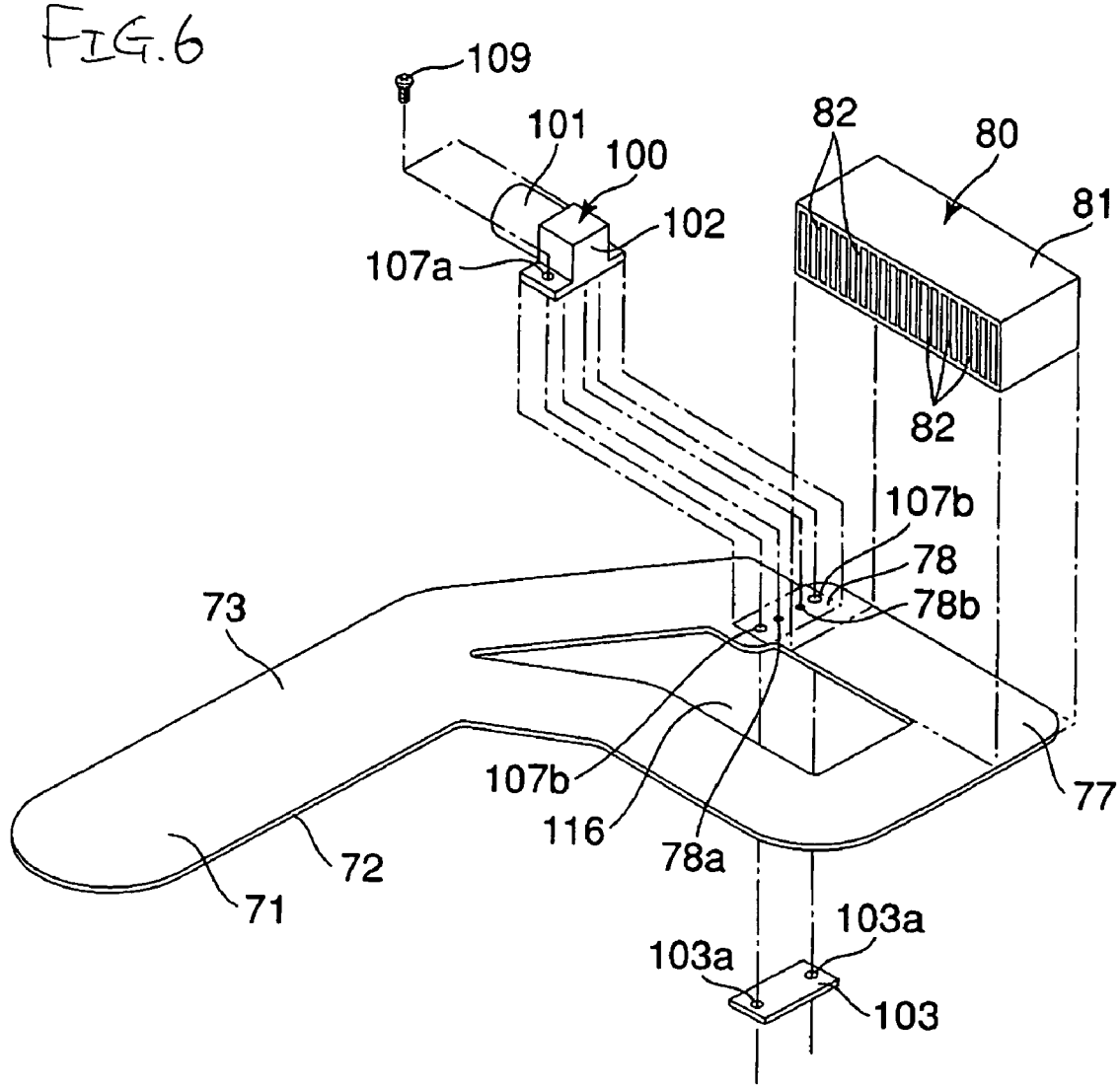
FIG. 6 is an exemplary perspective view showing that a fin and a pump, both of which are shown in FIG. 4, are connected to the heat transfer member.

FIG. 6 shows that the fin 80 is thermally connected to the heat transfer member 70. As shown in FIGS. 4 and 6, the heat-sinking section 77 is formed at a position in the heat transfer member 70 opposite the linear section 71. The heat-sinking section 77 extends in, e.g., a direction which is essentially orthogonal to the linear section 71. The heat-sinking section 77 is formed in the second plate member 73.

As shown in FIG. 6, the pump mount section 78 is formed at a location in the first plate member 72 adjacent to the heat-sinking section 77. A pump 100, which will be described later, is fixed to the pump mount section 78.

The passage 110 is formed between the first plate member 72 and the second plate member 73. As shown in FIG. 5, in the present embodiment, grooves 111 corresponding to the passages 110 are formed in a portion of the first plate member 72 contacting the second plate member 73; namely, the surface of the first plate member 72 contacting the second plate member 73. The grooves 111 are closed by the second plate member 73 in a fluid-tight manner. Namely, the flow passages are formed by means of closing the grooves 111 with the second plate member 73 in a fluid-tight manner. The grooves 111 are formed by means of, e.g., etching. The depth of the groove 111 is, e.g., about 0.3 mm.

Figure 7:
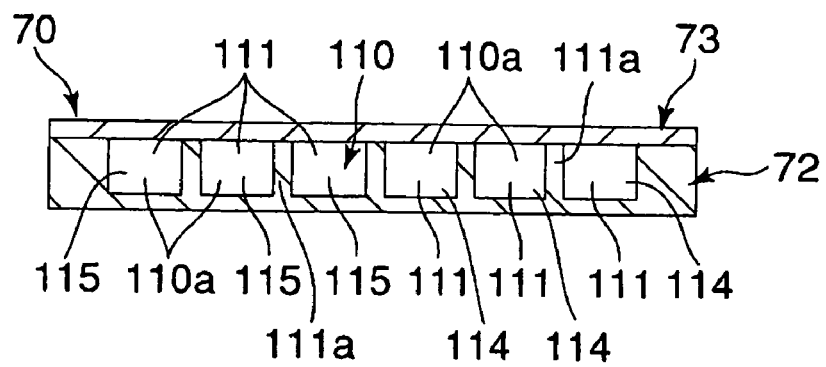
FIG. 7 is an exemplary cross-sectional view taken along line F7-F7 shown in FIG. 5.

The plural grooves 111 are thus formed. The grooves 111 extend in the same direction while being arranged in parallel to each other. The grooves 111 are formed in the number of, e.g., three. FIG. 7 is a cross-sectional profile taken along line F7-F7 in FIG. 5. As shown in FIG. 7, the passage 110 has the passage sections 110a corresponding to the respective grooves 111. Specifically, the first and second plate members 72, 73 form a multi-hole pipe having a plurality of passage sections 110a.

As shown in FIG. 5, the passage 110 has a first end section 112 and a second end section 113. The first end section 112 is located in the vicinity of the heat-sinking section 77. The second end section 113 is located in the vicinity of the pump mount section 78.

Each of the first and second end sections 112, 113 is a location on which the passage sections 110a concentrate. The grooves 111 concentrate on a point in the vicinity of the heat-sinking section 77 and another point in the vicinity of the pump mount section 78.

The passage 110 is formed so as to pass through the first through the third heat-receiving sections 74 to 76, and the respective grooves 111 are formed so as to pass through the first through third heat-receiving sections 74 to 76.

The layout of the grooves will be described specifically. The adjacent first and second heat-receiving sections 74, 75 are formed along the passage 110 in the linear section 71 of the heat transfer member 70. Therefore, in the present embodiment, the linear section 71 is an area where two or more adjacent heat-receiving sections are provided along the passage.

The grooves 111 are folded at the extremities of the linear section 71. As a result of the passages 110 being folded within the linear section 71, first portions 114 and second portions 115, where flowing directions of the passage 110 differ from each other, are present in the linear section 71.

In the first portions 114, coolant flows from the second heat-receiving section 75 to the first heat-receiving section 74. In the second portions 115, coolant flows from the first heat-receiving section 74 to the second heat-receiving section 75. In the present embodiment, the flowing direction of the first portions 114 is opposite the flowing direction of the second portions 115.

Cutouts or holes, which penetrate through the first and second plate members 72, 73, are not formed in the areas of the first and second plate members 72, 73 where the linear section 71 is formed. In the first and second plate members 72, 73, the areas where the linear section 71 is to be formed are continuous.

As shown in FIG. 7, the first portions 114 and the second portions 115 are adjacent to each other.

As shown in FIG. 5, a through hole 116 is formed in the vicinity of the heat-sinking section 77 of the heat transfer member 70. The through hole 116 penetrates through the first and second plate members 72, 73. By means of the through hole 116, an upstream portion of the passage 110 with respect to the heat-sinking section 77 and a downstream portion of the passage 110 with respect to the same are separated from each other.

Consequently, transfer of heat between the upstream portion of the passage and the downstream portion of the same relative to the heat-sinking section 77, which is performed by way of the first and second plate members 72, 73, is suppressed in the vicinity of the heat-sinking section 77.

Vertical walls 117 are formed in the groove 111 within areas corresponding to the first and third heat-receiving sections 74, 76. The vertical walls 117 extend along the groove 111. The vertical walls 117 are formed in consideration of maintaining continuous flow of coolant. The vertical walls 117 are formed integrally with, e.g., the first plate member 72. The vertical walls 117 have a height such that they abut the second plate member 73.

Since the vertical walls 117 serve as reinforcing materials, the rigidity of the first and third heat-receiving sections 74, 76 is enhanced. The vertical walls 117 may also be formed in areas of the grooves 111 corresponding to the second heat-receiving section 75.

In the heat transfer member 70 formed as described above, the first and second plate members 72, 73 are preferably affixed to each other by means of ordinary temperature bonding. As a result of the first and second plate members being subjected to ordinary temperature bonding, a brazing filler material is not required, thereby preventing an increase in the thickness of the heat transfer member 70. Moreover, even when the first plate member 72 and the second plate member 73 are very thin, they can be bonded together.

Incidentally, the ordinary temperature bonding is a method consisting of cleaning a face of the first plate member 72 and a face of the second plate member 73, which are to be bonded together, and applying pressure to the faces in a vacuum, to thus bond the faces together.

However, the method for bonding the first and second plate members 72, 73 is not limited to the ordinary temperature bonding. For instance, the first and second plate members 72, 73 may be bonded together in a fluid-tight manner by means of brazing as in the case of soldering.

The elastic modulus of the heat transfer member 70 is preferably 20000 or less. Accordingly, the heat transfer member 70 possesses comparatively high flexibility.

The air-tightness of the passage 100 is preferably $10E^{-4} Pa \cdot m^3/S$ or less as determined by an He leak vacuum method. The thickness of the heat transfer member 70 is preferably 0.2 mm to 0.8 mm. In the present embodiment, the thickness of the heat transfer member 70 is about 0.5 mm. Liquid coolant, such as water, alcohol, ammonium, CFC, or a CFC substitute, is contained, in the passage 110, in the proportion of 30 to 70% of the volume of the passage 110.

The fin 80 is an example heat-sinking member. The fin 80 is thermally connected to the heat-sinking section 77 of the heat transfer member 70. FIG. 6 shows that the fin 80 is thermally connected to the heat transfer member 70. As shown in FIG. 4, the area of the printed circuit board 23 corresponding to the fin 80 is cut out.

The fin 80 has a fin main body 81 and a plurality of fin members 82.

The layout of the heat transfer member 70 in the computer main body 20 will now be described. As shown in FIG. 3, the heat transfer member 70 is arranged in such a manner that the linear section 71, for instance, is aligned in the front-rear direction of the computer main body 20 and that the heat-sinking section 77 is aligned along the widthwise direction of the computer main body 20. Moreover, the heat transfer member 70 is arranged in such a manner that the heat-sinking section 77 is situated in the vicinity of the rear wall 21d of the first casing 21; e.g., at a position immediately before the rear wall 21d.

A plurality of vent holes 83 are formed at a position in the rear wall 21d of the computer main body 20, the position being opposite the heat-sinking section 77.

The fin main body 81 assumes, e.g., a tublar shape having an essentially rectangular cross-sectional profile. The fin members 82 are provided in the fin main body 81. The respective fin members 82 extend in a direction extending from one opening of the fin main body 81 to the other opening thereof. A gap is defined between the fin members 82, and allows a gas, such as air, to pass through the inside of the fin 80.

In consideration of the layout of the heat transfer member 70, the fin 80 is arranged such that the opening of the fin main body 81 opposes the vent holes 83 formed in the rear wall 21d of the first casing 21.

The fin main body 81 and the heat transfer member 70 are thermally connected together by means of an unillustrated cooling sheet. The heat of the coolant in the passage 110 is transmitted to the fin 80 in the heat-sinking section 77.

As shown in FIG. 6, the pump 100 is fastened to the pump mount section 78. As shown in FIG. 4, the area of the printed circuit board 23 corresponding to the pump 100 is cut out. The pump 100 has a pump main body 101, a coolant inlet/outlet section 102, and a screw plate 103.

The pump main body 101 has an unillustrated impeller and a drive section for driving the impeller. The coolant inlet/outlet section 102 is mounted to the pump main body 101 and draws coolant or discharges the thus-drawn coolant upon receipt of driving force from the pump main body 101.

Figure 8:
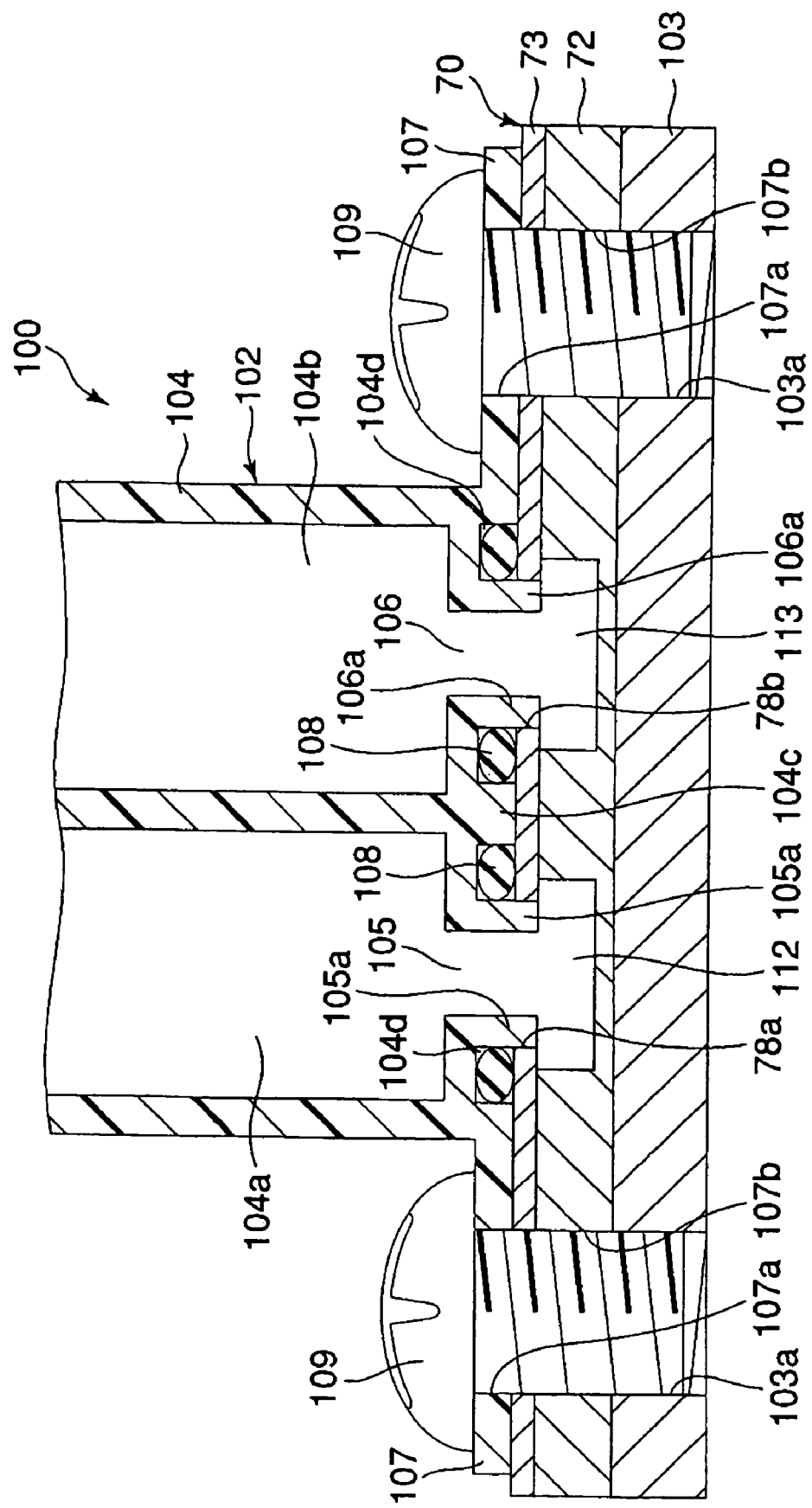
FIG. 8 is an exemplary cross-sectional view taken along line F8-F8 shown in FIG. 2.

A structure for fastening the pump 100 to the pump mount section 78 will now be described. FIG. 8 is a cross-sectional view taken along F8-F8 line in FIG. 2. FIG. 8 shows a cross-section of the coolant inlet/outlet section 102 and that of the pump mount section 78 and shows the structure for fastening the pump 100 to the pump mount section 78.

As shown in FIG. 8, the coolant inlet/outlet section 102 has a main body 104, an inlet port 105, an outlet port 106, and a flange section 107.

A first passage 104a which draws coolant inside upon receipt of driving force from the pump main body 101 and a second passage 104b which guides the coolant to the outside are provided in the main body 104.

The inlet port 105 is provided at the extremity of the first passage 104a, and draws coolant into the first passage 104a. The outlet port 106 is provided at the extremity of the second passage 104b, and discharges the coolant in the second passage 104b to the outside.

As shown in FIGS. 5 and 6, a first through hole 78a communicating with the inlet port 105 and a second through hole 78b communicating with the outlet port 106 are formed in the pump mount section 78. As illustrated, the first through hole 78a opposes the first end section 112. The second through hole 78b opposes the second end section 113.

The portion of the groove 111 opposing the first end section 112 and the portion of the groove 111 opposing the second end section 113 are formed in consideration of opposing the inlet port 105 and the outlet port 106, respectively.

As mentioned above, the first end section 112 and the second end section 113 are in mutual communication with each other by way of the pump 100. In short, an annular passage is formed by means of the passage 110 and the pump 100.

As shown in FIG. 8, the inlet port 105 is formed so as to become smaller than the first through hole 78a. A brim portion 105a of the inlet port 105 extends toward the pump mount section 78 so as to be accommodated in the first through hole 78a while the pump 100 is placed on the pump mount section 78. As a result of the brim section 105a extending until it is inserted into the first through hole 78a, the pump 100 is positioned to the heat transfer member 70 when the pump 100 is fastened thereto.

Likewise, the outlet port 106 is formed so as to become smaller than the second through hole 78b. A brim section 106a of the outlet port 106 extends toward the pump mount section 78 so as to be inserted in the second through hole 78b while the pump 100 is fastened to the pump mount section 78.

A seal accommodation groove 104d is formed in areas of a bottom wall 104c of the main body 104, which are located around the inlet port 105 and the outlet port 106. An O-ring 108 is accommodated in the seal accommodation groove 104d. When the pump 100 is fastened to the pump mount section 78, the inlet port 105 is sealed by an O-ring 108 in a fluid-tight manner. Likewise, the outlet port 106 is sealed in a fluid-tight manner.

The flange section 107 is formed on both ends of an area of the bottom wall 104c of the main body 104, where the inlet port 105 and the outlet port 106 are interposed between the flange sections, and extends to the outside. The respective flange sections 107 oppose the outside rather than the passage 110 in the heat transfer member 70.

A screw insert hole 107a is formed in each of the flange sections 107. The screw insert hole 107a penetrates through the corresponding flange section 107.

As shown in FIGS. 5 and 6, a screw insert hole 107b is formed in an area of the heat transfer member 70 opposing the screw insert hole 107a. Namely, the screw hole 107b is formed in the first and second plate member 72, 73.

The screw insert hole 107a formed in the flange section 107 and the screw insert hole 107b formed in the heat transfer member 70 are in mutual communication.

The screw plate 103 is disposed opposite the pump 100 with the heat transfer member 70 interposed therebetween. The screw plate 103 has a width corresponding to the pump mount section 78. The screw holes 103a are formed at positions of the screw plate 103 corresponding to the insert holes 107a, 107b. A female thread is formed on an interior wall of the screw hole 103a.

By means of the pump mount structure formed as mentioned above, the pump 100 is fastened to the heat transfer member 70 as will be described below.

First, the coolant inlet/discharge section 102 is placed on the pump mount section 78. The brim section 105a of the inlet port 105 is inserted into the first insert hole 78a. The brim section 106a of the outlet port 106 is inserted into the second through hole 78b.

Next, the screw plate 103 is provided. Screws 109 are inserted into the respective screw insert holes 107a, 107b. The screws 109 are screw-engaged with the screw holes 103a formed in the screw plate 103. The screws 109 are fastened until the O-rings 108 function. In this way, the pump 100 is fastened to the heat transfer member 70.

As shown in FIGS. 2, 3, and 4, the fan 90 is disposed opposite the fin 80. As shown in FIG. 4, the fan 90 is placed on the side of the heat transfer member 70 where the fin 80 is fastened; namely, on the upper side of the second plate member 73. Specifically, the fan 90 is disposed on the upper side of the second plate member 73. An area in the printed circuit board 23, which corresponds to the fan 90, is cut out.

Figure 9:
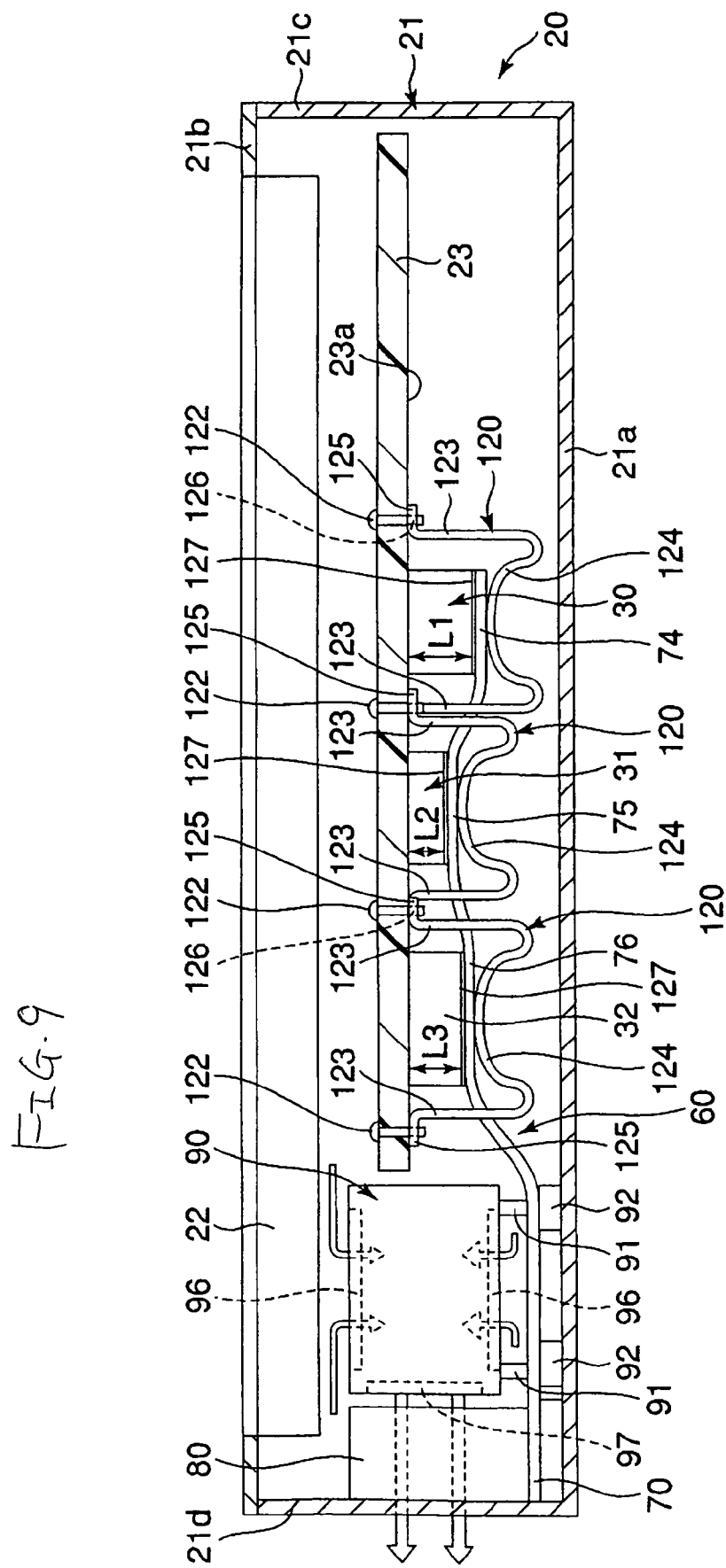
FIG. 9 is an exemplary cross-sectional view taken along line F9-F9 shown in FIG. 2.

FIG. 9 is a cross-sectional profile taken along line F9-F9 shown in FIG. 2. FIG. 9 shows a vertical layout relationship among the first through third heating elements 30 to 32; the printed circuit board 23; and the cooling device 60.

As shown in FIG. 9, in the present embodiment, the fan 90 is fastened to the first casing 21 by use of, e.g., screws 91. Specifically, a boss section 92 protruding toward the fan 90 is formed on the bottom wall of the first casing 21. Through holes through which the screws 91 penetrate are formed in the fan 90. After having penetrated through the through hole of the fan 90, the screws 91 are screw-engaged with the boss section 92. Thereby, the fan 90 is fastened to the first casing 21. However, an object to which the fan 90 is to be fastened is not limited to the first casing. For instance, the fan 90 may be fastened to the heat transfer member 70.

As shown in FIG. 4, the fan 90 has a fan main body 93, an impeller 95 housed in the fan main body 90, and the like. An inlet port 96 is formed in an upper wall 90a and a lower all 90b of the fan main body 93. The fan main body 93 draws ambient air inside through the inlet port 96. The lower wall 90b of the fan main body 93 opposes the second plate member 73 of the heat transfer member 70. As indicated by a chain double-dashed line, the inlet port 96 formed in the lower wall 90b of the fan main body 93 opposes the second plate member 73. Therefore, the air to be drawn into the air inlet port 96 formed in the lower wall 90b comes into contact with the heat transfer member 70 before reaching the inlet port 96.

An outlet port 97 is formed in the fan main body 93. The outlet port 97 is communicating with the outside and with the inside of the fan main body 93. The outlet port 97 is formed so as to oppose the fin 80. Therefore, the air drawn by way of the inlet port 96 is discharged toward the fin 80 by way of the outlet port 97. The thus-discharged air escapes to the outside of the computer main body 20 by way of the vent holes 83 formed in the rear wall 21d of the first casing 21.

The structure for connecting the first to third heat-receiving sections 74 to 76 with the first to third heating elements 30 to 32 will now be described.

As shown in FIG. 9, each of the first to third heat-receiving sections 74 to 76 is thermally connected to the corresponding first to third heating element 30 to 32 by use of a leaf spring 120 and screws 122.

The structure for connecting the second heat-receiving section 75 with the second heating element 31 and the structure for connecting the third heat-receiving section 76 with the third heating element 32 may be the same as the structure for connecting the first heat-receiving section 74 with the first heating element 30. Therefore, the structure for connecting the first heat-receiving section 74 to the first heating element 30 will be described as a typical example.

The leaf spring 120 has, e.g., a pair of vertical wall sections 123 and a spring section 124. The spring section 124 is provided between the extremities of the vertical wall sections 123. The respective vertical wall sections 123 and the spring section 124 are formed, e.g. in an integrated fashion.

The spring section 124 deforms so as to protrude in, e.g., the shape of a circular arc, in a direction in which the vertical wall sections 123 extend. Flange sections 125, which extend outside, are formed at the other ends of the respective vertical wall sections 123. Screw holes 126 are formed in the respective flange sections 125. A female thread is formed in each of the screw holes 126.

Grease 127 is applied over the surfaces of the first through third heating elements 30 to 32 in order to enhance thermal connection.

As a result of having been deformed, the first heat-receiving section 74 is pressed against the first heating element 30. In this state, the leaf spring 120, the first heat-receiving section 74, and the first heating element 30 are assembled. Specifically, the leaf spring 120 is placed such that the first heating element 30 and the first heat-receiving section 74 are situated between the vertical wall sections 123. At this time, the spring section 124 comes into contact with the first heat-receiving section 74. The flange sections 125 are brought into contact with the lower surface 23a of the printed circuit board 23. The spring section 124 is adjusted so as to become deformed when the flange sections 125 come into contact with the printed circuit board 23, to thus press the first heat-receiving section 74 against the first heating element 30.

When the leaf spring 120 is placed, the screws 122 are inserted into the printed circuit board 23 from above. The screws 122 are screw-engaged with the screw holes 126 formed in the flange sections 125. By means of such a configuration, the leaf spring 120 impels the first heat-receiving section 74 to the first heating element 30, and is fastened, while remaining thermally connected together, to the printed circuit board 23.

The leaf spring 120 used for the structure that connects the second heat-receiving section 75 to the second heating element 31 is formed in accordance with the structure, and the leaf spring 120 used for the structure that connects the third heat-receiving section 76 to the third heating element 32 is formed in accordance with the structure. The shape of the leaf springs 120 is not limited to the above-described pattern having the pair of vertical wall sections 123 and the spring section 124. The requirement for the leaf spring 120 is to have the function of, while being fixed to the printed circuit board 23, pressing the first to third heat-receiving sections 74 to 76 against the corresponding first to third heating elements 30 to 32.

The height L1 of the first heating element 30, the height L2 of the second heating element 31, and the height L3 of the third heating element 32 differ from each other as illustrated.

However, as mentioned above, the heat transfer member 70 has an elastic modulus of 20000 or less and is formed thinly, the heat transfer member 70 has flexibility. Since the heat transfer member 70 has flexibility, the first to third heat-receiving sections 74 to 76 are thermally connected, as a result of being bent, to the first to third heating elements 30 to 32. As mentioned above, the heat transfer member 70 is formed, as a result of being bent, in accordance with the respective heating elements. In short, the heat transfer member 70 corresponds to variations in the height of the heating elements 30, 31, and 32.

An area of the printed circuit board 23 corresponding to the fin 80, the pump 100, and the fan 90 is cut out. The height of the fan 90 and that of the fin 80 are greater than the height of the printed circuit board 23 and those of the first to third heating elements 30 to 32. Therefore, as shown in FIG. 9, the printed circuit board 23 and the first to third heating elements 30 to 32 are arranged within the height of the fin 80 and that of the fan 90. In the computer main body 20, the vertical dimension occupied by the cooling device 60 and the printed circuit board 23 can be made small.

Operation of the cooling device 60 will now be described.

As shown in FIG. 5, the coolant L discharged from the outlet port 106 of the pump 100 flows through the inside of the passages 110 from the second end 113 to the first end 112 along the direction B; i.e., toward the heat-sinking section 77. First, the coolant L extracts heat from the third heating element 32 in the third heat-receiving section 76.

The coolant L reaches the linear section 71. In the linear section 71, the coolant L extracts heat from the first heating element 30 after having extracted heat from the second heating element 31.

The passage 110 is bent at a turning point X within the linear section 71. The first and second portions 114 and 115 of the passage 110 pass through the first and second heat-receiving sections 74, 75. The linear section 71 is continuous.

The temperature of the coolant L in the linear section 71 are made substantially uniform by transmitted through the first and second plate members 72, 73.

In short, the temperature of the coolant L reaching the second heat-receiving section 75 and the temperature of the coolant L reaching the first heat-receiving section 74 become substantially the same. Therefore, the heat-receiving portion in the linear section 71 is effectively cooled. Thus, the first heat-receiving section 74 is also cooled effectively. The coolant having left the linear section 71 reaches the fin 80. The heat of the coolant L having reached the fin 80 is transmitted to the fin 80. The heat having transmitted to the fin 80 migrates to the air blown by the fan 90 and is discharged to the outside of the computer main body 20 by way of the vent holes 83.

The coolant L having passed through the fin 80 gathers at the first end 112. The coolant L having gathered at the first end 112 is sucked by the pump 100 by way of the inlet port 105, and is discharged to the second end 113 by way of the outlet port 106. As mentioned above, the coolant flows in one direction through the inside of the passage 110. In short, the coolant L circulates through the inside of the passage 110 in one direction.

The cooling device 60 of the portable computer 10 constructed as described above does not have a structure which utilizes phase transformation of the coolant L, but has a structure where the coolant L circulates through the inside of the passage 110 in one direction. In short, liquid coolant and gaseous coolant do not flow back and forth within the passage 110, and hence the passage 110 does not need to be of a size which allows back-and-forth circulation of liquid coolant and gaseous coolant.

Moreover, since the first to third heat-receiving sections 74 to 76 are formed in the second plate member 73, an additional heat-receiving member is not required.

Therefore, the cooling device 60 is formed thinly and has a simple structure. Since the cooling device 60 can be slimmed down, the portable computer 10 can also be slimmed down.

As a result of forming the plural grooves 111, wall portions 111a defined between the adjacent grooves 111 function as pillars, and therefore collapse of the passage 110 is prevented.

As a result of the passage 110 running through the first to third heat-receiving sections 74 to 76, the first to third heating elements 30 to 32 are efficiently cooled.

The upstream portion of the first plate member 72 relative to the heat-sinking section 77 and the downstream portion of the same relative to the heat-sinking section 77 are separated from each other by means of the through hole 116. Similarly, the upstream portion of the second plate member 73 relative to the heat-sinking section 77 and the downstream portion of the same relative to the heat-sinking section 77 are separated from each other by means of the through hole 116. Therefore, the coolant L that has been discharged from the pump 100 and has a low temperature is prevented from exchanging heat with the coolant L that has a high temperature and is to flow into the heat-sinking section 77, by way of the first and second plate members 72, 73. Therefore, the temperature of the coolant L that flows into the first to third heat-receiving sections 74 to 76 is maintained at a low level.

As a result of the vertical walls 117 being formed in the grooves 111, the rigidity of the heat-receiving sections 74 to 76 is enhanced. Consequently, even when the first to third heat receiving sections 74 to 76 are thermally connected to the first to third heating elements 30 to 32, collapse of the passage 110 is prevented. Moreover, the heat of the respective heating elements 30 to 32 migrates to the heat transfer member 70 by way of the vertical walls 117. Hence, the respective heating elements 30 to 32 are effectively cooled.

As a result of providing the heat transfer member 70 adapted to variations in the height of the heating elements 30 to 32, the heat transfer member 70 is used commonly among the first to third heating elements 30 to 32. Consequently, occurrence of an increase in the number of parts constituting the cooling device 60 is prevented, and hence the cooling device 60 is constructed in a simple structure.

The fin 80, the fan 90, the pump 100, and the printed circuit board 23 are located on the same side of the heat transfer member 70, and hence the vertical dimension occupied by the cooling device 60 and the printed circuit board 23 in the computer main body 20 can be reduced. As a result, the portable computer 10 is slimmed down.

The inlet port 96 formed in the lower wall 90b of the fan main body 93 opposes the heat transfer member 70. Hence, the air flowing into the inlet port 96 comes into contact with the heat transfer member 70. Therefore, the heat transfer member 70 is cooled by the above-described flow of air, as well.

The heat transfer member 70 is a multi-hole pipe, and the area of the heat transfer member 70 by means of which the heating elements 30 to 32 thermally contact the heat transfer member 70 is ensured to be sufficient. Namely, the heat-receiving sections 74 to 76 are formed in correspondence to the respective heating elements 30 to 32. Therefore, the heat of the respective heating elements 30 to 32 is efficiently transmitted to the corresponding heat-receiving sections 74 to 76.

In the present embodiment, the respective grooves 111 are formed by means of etching. Therefore, the shape of the respective grooves 111 is not limited and is formed so as to correspond to the respective heating elements 30 to 32. Moreover, in the present embodiment, the first plate member 72 and the second plate member 73 are joined together by means of ordinary temperature bonding. Therefore, even when the first plate member 72 and the second plate member 73 are very thin, they can be bonded together.

The passage 110 is folded at the turning point X in the linear section 71. The first and second portions 114, 115 of the passage 110 run through the first and second heat-receiving sections 74, 75. Moreover, the linear section 71 extends continuously.

Therefore, the temperature of the coolant L in the linear section 71 travels to the first and second plate members 72, 73, to thus be made substantially uniform. Accordingly, the temperature of the coolant L reaching the second heat-receiving section 75 and the temperature of the coolant L reaching the first heat-receiving section 74 become substantially the same. Therefore, the heat-receiving sections in the linear section 71 are effectively cooled.

In the present embodiment, the heat-receiving sections 74 to 76 are formed in the second plate member 73, but the location where the heat-receiving sections are to be formed is not limited to the second plate member. When the first plate member 72 opposes the respective heating elements 30 to 32; for instance, when the first plate member 72 shown in FIG. 4 is located at a position above the second plate member 73, the respective heat-receiving sections 74 to 76 are formed in the first plate member 72.

In the present embodiment, the heat-sinking section 77 is formed on the second plate member 73. However, the location where the heat-sinking section is to be formed is not limited to the second plate member. When the respective heat-receiving sections 74 to 77 are formed on the first plate member 72, the heat-sinking section 77 may be formed on the first plate member 72. By means of this configuration, the respective heating elements 30 to 32, the fin 80, and the printed circuit board 23 are situated on the same side of the heat transfer member 70. Therefore, the vertical dimension occupied by the cooling device 60 and the printed circuit board 23 within the computer main body 20 can be reduced.

In the present embodiment, the fan 90 is disposed at a position on the part of the second plate member 73. However, the location where the fan is to be situated is not limited to the second plate member. When the respective heat-receiving sections 74 to 76 and the heat-sinking section 77 are provided at a position on the part of the first plate member 72, the fan 90 may be provided on the first plate member 72. By means of this arrangement, the respective heating elements 30 to 32, the fin 80, the fan 90, and the printed circuit board 23 are situated on the same side of the heat transfer member 70. As a result, the vertical dimension occupied by the cooling device 60 and the printed circuit board 23 in the computer main body 20 can be reduced.

In the present embodiment, the pump 100 is fastened to the second plate member 73, and the first and second through holes 78a, 78b are formed in the second plate member 73. However, the location where the pump is to be fixed and the locations where the through holes are to be formed are not limited to those mentioned above. When the respective heat-receiving sections 74, 75 and the heat-sinking section 77 are provided on the first plate member 72 and when the fan 90 is disposed on the side of the first plate member 72, the pump 10 may also be fastened to the first plate member 72. In this case, the first and second through holes 78a, 78b are formed in the first plate member 72. By means of this arrangement, the respective heating elements 30 to 32, the fin 80, the fan 90, the pump 100, and the printed circuit board 23 are situated on the same side of the heat transfer member 70. Therefore, the vertical dimension occupied by the cooling device 60 and the printed circuit board 23 in the computer main body 20 can be reduced.

An electronic apparatus according to a second embodiment of the present invention will now be described by means of taking the portable computer 10 as an example and by use of FIGS. 10 and 11. Elements that are analogous to those of the first embodiment will be assigned the same reference numerals, and repeated explanations are omitted.

The present embodiment differs from the first embodiment in that the passage 110 is formed circularly. In other respects, the present embodiment is the same as the first embodiment. A specific explanation is given of this point of difference.

Figure 10:
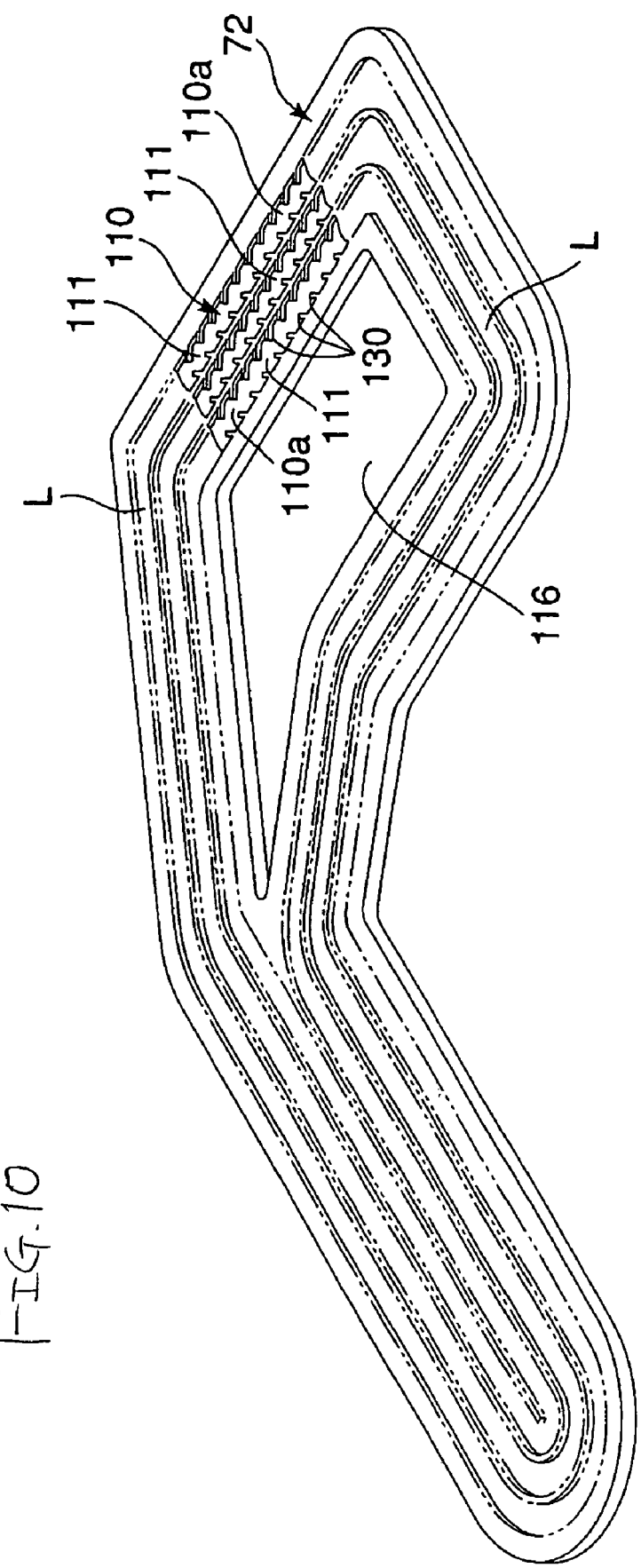
FIG. 10 is an exemplary perspective view of a first plate member of a cooling device of a portable computer according to a second embodiment of the present invention.

FIG. 10 shows the first plate member 72. As shown in FIG. 10, the respective passage sections 110a are formed circularly and the passage 110 is formed circularly. Consequently, the coolant L circulates through the inside of the passage 110.

In the present embodiment, the heat of the coolant L migrates toward the heat-sinking section 77 by means of self-excited vibration of the coolant L. Therefore, the pump 100 is not used in the present embodiment.

Protruding sections 130 are formed over the entireties of the sidewall sections of the grooves 111. In short, the protruding sections 130 are formed over the entirety of the passage 110. The respective protruding sections 130 are tilted in direction B where the coolant L flows. The drawing shows only a portion of the passage 110, and the other portion of the same represented by the chain double-dashed line.

Figure 11:
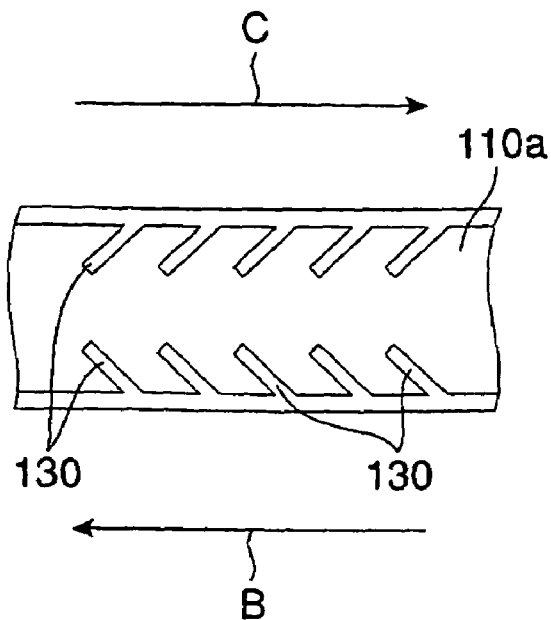
FIG. 11 is an exemplary plan view showing a portion of a passage section shown in FIG. 10.

FIG. 11 shows a portion of the passage section 110a shown in FIG. 10. As shown in FIG. 11, the protruding sections 130 are of a substantially-plate-like shape.

Next, operation of the cooling device 60 of the present embodiment will be described. As a result of the coolant L causing self-excited vibration, the coolant L moves in the direction B. At this time, the coolant L can smoothly move in the direction B along the inclination of the protruding sections 130.

The coolant L then moves in direction C opposite the direction B. However, movement of the coolant L is hindered by the protruding sections 130. Namely, as a result of the protruding sections 130 being tilted in the direction B, the coolant L encounters difficulty in moving in the direction C. As mentioned above, the coolant L comes to flow in the direction B by means of self-excited vibration. The direction B referred to herein is the first direction.

The present embodiment yields the same advantage as that yielded by the first embodiment. Moreover, the pump 100 is not required, and hence the structure of the cooling device 60 is simplified. As a result of formation of the protruding sections 130, the coolant L comes to flow. The first to third heating elements 30 to 32 are effectively cooled.

An electronic apparatus according to a third embodiment of the present invention will now be described by means of taking the portable computer 10 as an example and with reference to FIG. 12. Those elements which are the same as those of the second embodiment are assigned the same reference numerals, and repeated explanations are omitted.

The present embodiment differs from the second embodiment in terms of the shape of the protruding section 130. In other respects, the present embodiment is the same as the second embodiment. An explanation is given to this point of difference.

Figure 12:
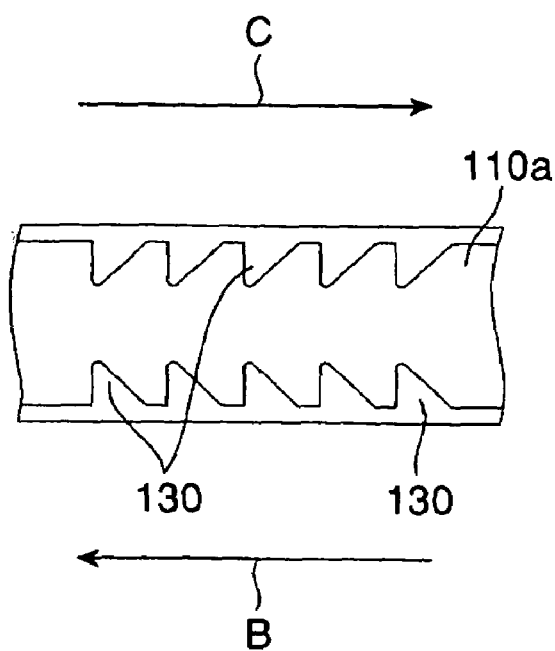
FIG. 12 is an exemplary plan view showing a portion of a passage section of a cooling device of a portable computer according to a third embodiment of the present invention.

FIG. 12 shows a portion of the passage section 110a of the present embodiment in an enlarged manner. As shown in FIG. 12, the protruding sections 130 are formed in a substantially-triangular shape. The present embodiment can yield the same advantage as that yielded by the second embodiment.

Figure 13:
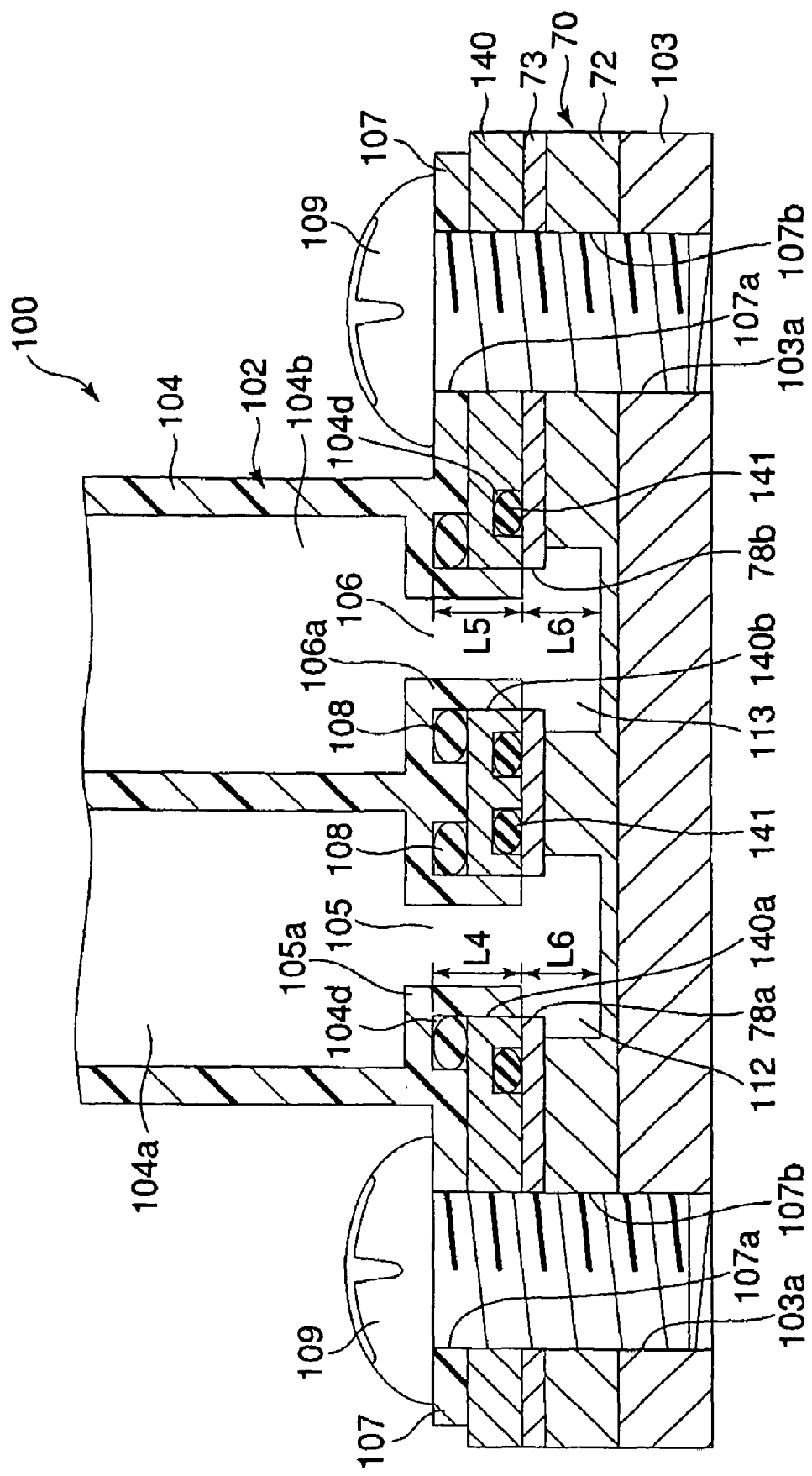
FIG. 13 is an exemplary cross-sectional view showing a structure for attaching a pump to a heat transfer member, both of which belong to a portable computer according to a fourth embodiment of the present invention.

Next, an electronic apparatus according to a fourth embodiment of the present invention will be described by means of taking the portable computer 10 as an example and with reference to FIG. 13. The configuration whose functions are the same as those of the first embodiment is assigned the same reference numerals, and repeated explanations thereof are omitted.

The present embodiment differs from the first embodiment in terms of the structure for bonding the pump 100 to the heat transfer member 70. In other respects, the present embodiment is the same as the first embodiment.

This point of difference will now be described. FIG. 13 shows the structure for bonding the pump 100 of the present embodiment to the heat transfer member 70. As shown in FIG. 13, in the present embodiment, a spacer 140 is interposed between the coolant inlet/discharge section 102 and the second plate member 73.

In the spacer 140, through holes 140a, 140b, which are substantially the same in size as the through holes 78a, 78b, are formed at the positions corresponding to the through holes 78a, 78b. O-rings 141 are provided around the respective through holes 140a, 140b. The first and second through holes 78a, 78b are in mutual communication with the through holes 140a, 140b in a fluid-tight manner.

The present embodiment can yield the same advantage as that yielded by the first embodiment. Moreover, for instance, when a length L4 of the brim section 105a of the inlet port 105 and a length L5 of the brim section 106a of the outlet port 106 are longer than the height L6 from the bottom surface of the passage 110 to the face of the second plate member 73 opposite the first plate member 72, the extremities of the brim sections 105a, 106a are prevented from contacting the bottom surfaces of the grooves 111 by means of interposing the spacer 140.

Specifically, as a result of the extremities of the brim sections 105a, 106a contacting the bottom surfaces of the grooves 111, a clearance is formed between the coolant inlet/discharge section 102 and the heat transfer member 70. The coolant L is considered to leak from the clearance. However, interposing the spacer 140 prevents occurrence of such a leakage.

An electronic apparatus according to a fifth embodiment of the present invention will now be described by means of taking the portable computer 10 as an example and with reference to FIG. 14. The configuration whose functions are the same as those of the first embodiment is assigned the same reference numeral, and repeated explanations thereof are omitted.

The present embodiment differs from the first embodiment in terms of the shape of the second plate member 73. In other respects, the present embodiment is the same as the first embodiment. An explanation is given to this point of difference.

Figure 14:
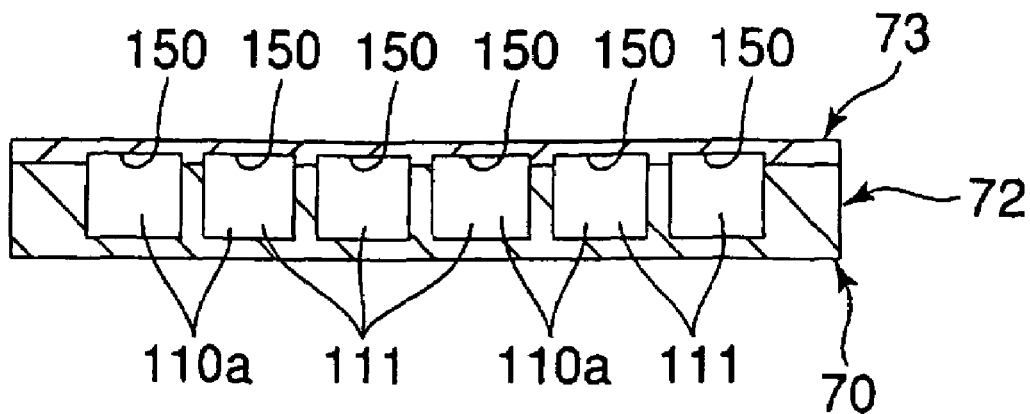
FIG. 14 is an exemplary cross-sectional view of the heat transfer member of a cooling device in the portable computer according to the fourth embodiment of the present invention.

FIG. 14 shows a cross-sectional profile of the heat transfer member 70 of the present embodiment. As shown in FIG. 14, grooves 150 corresponding to the passage 110 are formed in the second plate member 73, as well. The grooves 111 of the first plate member 72 oppose the grooves 150 of the second plate member 73. The respective passage sections 110a are formed from the grooves 111 and the grooves 150. In this case, the vertical walls 117 may be formed on the second plate member 73. In short, the vertical walls 117 may be formed so as to extend from the bottom surfaces of the grooves 111 formed on the first plate member 72 to the bottom surfaces of the grooves 150 formed on the second plate member 73.

The present embodiment can yield the same advantage as that yielded by the first embodiment. Moreover, the passage 110 can be made large. In accordance with an increase in the amount of coolant, the first to third heating elements 30 to 32 are effectively cooled.

Even in the second embodiment, the grooves 150 may be formed in the second plate member 73.

Figure 15:
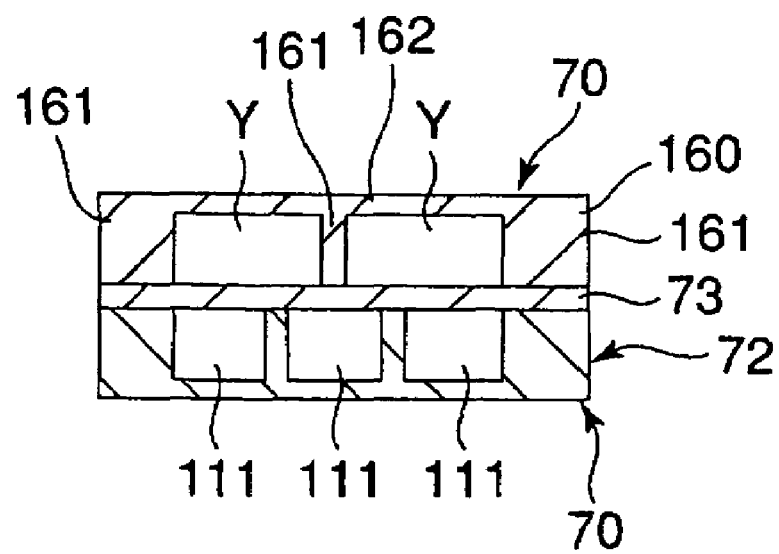
FIG. 15 is an exemplary cross-sectional view showing a position in a heat transfer member of a cooling device of a portable computer according to a fifth embodiment of the present invention, wherein the position avoids first to third heating elements.

An electronic apparatus according to a sixth embodiment of the present invention will now be described by means of taking the portable computer 10 as an example and with reference to FIG. 15. The configuration whose elements are the same as those of the first embodiment is assigned the same reference numerals, and repeated explanations thereof are omitted.

The present embodiment differs from the first embodiment in that a third plate member 160 is connected to a location on the heat transfer member 70 which is different from the positions of the first to third heating elements 30 to 32. In other respects, the present embodiment is the same as the first embodiment.

Specific explanation will now be given to this point of difference. FIG. 15 shows a cross section acquired at a position on the heat transfer member 70 which avoids the positions of the first to third heating elements 30 to 32. As shown in FIG. 15, the third plate member 160 is connected to, e.g., a position on the second plate member 73 which avoids the locations of the first to third heating elements 30 to 32. The third plate member 160 has a partition wall 161 which extends toward the second plate member 73. In the present embodiment, the partition wall 161 is formed in the number of three.

The respective partition walls 161 come into contact with the second plate member 73. A hermetic space Y is defined by the respective partition walls 161, a bottom wall 162 of the third plate member 160, and the second plate member 73. The inside of the space Y is maintained at vacuum.

The present embodiment can yield the same advantage as that yielded by the first embodiment. Moreover, since the inside of the space Y is maintained at vacuum, the heat of the coolant L is less likely to escape to the outside by way of the third plate member 160.

Even when the heat transfer member 70 is positioned at a location close to the wall section of the first casing 21, the heat of the heat transfer member 70 is prevented from traveling to the first casing 21 by means of bonding the third plate member 160 between the wall section and the heat transfer member 70 as mentioned above.

The third plate member 160 may assume a shape substantially the same as that of the first plate member 72. In this case, the third plate member 160 is bonded to the first plate member 72 in order to avoid the first to third heating elements 30 to 32. The wall sections 111a defined between the grooves 111 formed on the third plate member 160 function as the partition walls 161.

While certain embodiments of the inventions have been described, these embodiments have been presented by way of example only, and are not intended to limit the scope of the inventions. Indeed, the novel structure described herein may be embodied in a variety of other forms; furthermore, various omissions, substitutions and changes in the structure described herein may be made without departing from the spirit of the inventions. The accompanying claims and their equivalents are intended to cover such forms of modifications as would fall within the scope and spirit of the inventions.

What is claimed is:

1. A cooling device comprising:
a heat transfer unit thermally connected to a mounted first heating element and a mounted second heating element whose mounted height is higher than that of the first heating element, the heat transfer unit including (i) a passage through which a coolant circulates, (ii) a heat-receiving section having a first portion thermally connected to the first heating element and a second portion thermally connected to the second heating element, (iii) a heat-sinking section that dissipates heat received by the heat-receiving section, (iv) a first plate member in which is formed a first groove corresponding to the passage, (v) a second plate member that covers the first groove, and (vi) a third plate member coupled to at least one of the first and second plate members, the third plate member includes partition wall sections that extend toward and are connected to one of the first and second plate members, and a hermetic space is defined by the partition wall sections and the one of the first and second plate members;

wherein the heat-receiving section is formed at least one of the first and second plate members.

2. The cooling device according to claim 1, wherein the passage is formed circularly.

3. The cooling device according to claim 1, further comprising a pump including an inlet port and a discharge port.

4. The cooling device according to claim 1, wherein a second groove corresponding to the passage is formed in the second plate member.

5. The cooling device according to claim 1, wherein the first groove comprises a plurality of grooves extending in parallel with each other.

6. The cooling device according to claim 1, wherein the first groove extends across the heat-receiving section wherein the first groove being one of a plurality of grooves extending in substantially parallel with one another from the heat-receiving section to the heat-sinking section.

7. The cooling device according to claim 1, wherein a through hole is formed in a vicinity of the heat-sinking section of the first and second plate members for separating the passage into a segment upstream of the heat-sinking section and another segment downstream of the heat-sinking section.

8. The cooling device according to claim 1, wherein a vertical wall extending along the groove is provided in an area of the groove, the area located within a region corresponding to the heat-receiving section.

9. The cooling device according to claim 1, wherein the groove is turned so that first and second passages of different flow directions are provided within an area where the first and second portions of the heat-receiving section are adjacently provided along the passage.

10. An electronic apparatus comprising:
a casing;
first and second heating elements housed in the casing; and
a cooling device that cools the first and second heating elements, the cooling device comprising:
a heat transfer unit thermally connected to the mounted first heating element and the mounted second heating element whose mounted height is higher than that of the first heating element, the heat transfer unit including a passage through which a coolant circulates, a heat-receiving section having a first portion thermally connected to the first heating element and a second portion thermally connected to the second heating element, a heat-sinking section that dissipates heat received by the heat-receiving section, a first plate member in which is formed a first groove corresponding to the passage, a second plate member that covers the first groove, and a third plate member coupled to at least one of the first and second plate members, the third plate member includes partition wall sections that extend toward one of the first and second plate members, and a hermetic space is defined between the partition wall sections and the one of the first and second plate members, the partition wall sections being connected to at least one of the first and second plate members;

wherein the heat-receiving section is formed at least one of the first and second plate members.

11. The electronic apparatus according to claim 10, wherein the passage is formed circularly.

12. The electronic apparatus according to claim 10, further comprising a pump including an inlet port and a discharge port.

13. The electronic apparatus according to claim 10, wherein a second groove corresponding to the passage is formed in the second plate member.

14. The electronic apparatus according to claim 10, wherein the first groove comprises a plurality of grooves extending in parallel with each other.

15. The electronic apparatus according to claim 10, wherein the first groove extends across the heat-receiving section wherein the first groove being one of a plurality of grooves extending in substantially parallel with one another from the heat-receiving section to the heat-sinking section.

16. The electronic apparatus according to claim 10, wherein a through hole is formed in a vicinity of the heat-sinking section of the first and second plate members for separating the passage into a segment upstream of the heat-sinking section and another segment downstream of the heat-sinking section.

17. The electronic apparatus according to claim 10, wherein a vertical wall extending along the groove is provided in an area of the groove, the area located within a region corresponding to the heat-receiving section.

18. The electronic apparatus according to claim 10, wherein the groove is turned so that first and second passages of different flow directions are provided within an area where the first and second portions of the heat-receiving section are adjacently provided along the passage.

* * * * *